United States Patent [19]
Kimura

[11] Patent Number: 5,471,166
[45] Date of Patent: Nov. 28, 1995

[54] LOGARITHMIC AMPLIFYING CIRCUIT USING QUADRITAIL CELLS

[75] Inventor: Katsuji Kimura, Tokyo, Japan

[73] Assignee: NEC Corporation, Tokyo, Japan

[21] Appl. No.: 274,435

[22] Filed: Jul. 13, 1994

[30] Foreign Application Priority Data

Jul. 13, 1993 [JP] Japan .................... 5-196936

[51] Int. Cl.$^6$ .......................... G06F 7/556; G06G 7/24
[52] U.S. Cl. ............................. 327/351; 327/352
[58] Field of Search .................... 327/350, 351, 327/352, 353, 334, 354, 303, 184, 104, 531

[56] References Cited

U.S. PATENT DOCUMENTS

| | | | |
|---|---|---|---|
| 4,090,150 | 5/1978 | Vachenauer | 330/302 |
| 4,794,342 | 12/1988 | Kimura | 330/2 |
| 5,057,717 | 10/1991 | Kimura | 327/350 |
| 5,319,264 | 6/1994 | Kimura | 327/350 |
| 5,345,185 | 9/1994 | Gilbert | 327/350 |

FOREIGN PATENT DOCUMENTS

| | | |
|---|---|---|
| 62-293807 | 12/1987 | Japan . |
| 62-292010 | 12/1987 | Japan . |
| 4-165805 | 6/1992 | Japan . |

OTHER PUBLICATIONS

K. Kimura, "Some Circuit Design Techniques ... Rectifiers Operable on Low Supply Voltage", *IEEE Trans. on Cir. and Sys.–I: Fund. Theory and Applns*, vol. 39, No. 9, Sept. 1992, pp. 771–777.

*Primary Examiner*—Timothy P. Callahan
*Assistant Examiner*—Toan Tran
*Attorney, Agent, or Firm*—Sughrue, Mion, Zinn, Macpeak & Seas

[57] ABSTRACT

A logarithmic amplifying circuit with a wide input dynamic range using cascade-connected differential amplifiers, a rectifier connected to each of the amplifiers and an adder for adding the output currents of the rectifiers. The rectifiers each have a quadritail cell which consists of a single tall current source and four transistors. The transistors are emitter-connected or source-connected and driven by the tail current source. The bases or gates of the first and second transistors of the quadritail cell are connected to respective terminals of a differential input pair of the rectifier. The collectors or drains of the first and second transistors are connected in common to one terminal of a differential output pair of the rectifier, and the collectors or drains of the third and fourth transistors are connected in common to the other output terminal of the rectifier. Further, the bases or gates of the third and fourth transistors are connected in common and receive a neutral voltage corresponding to the differential input.

13 Claims, 7 Drawing Sheets

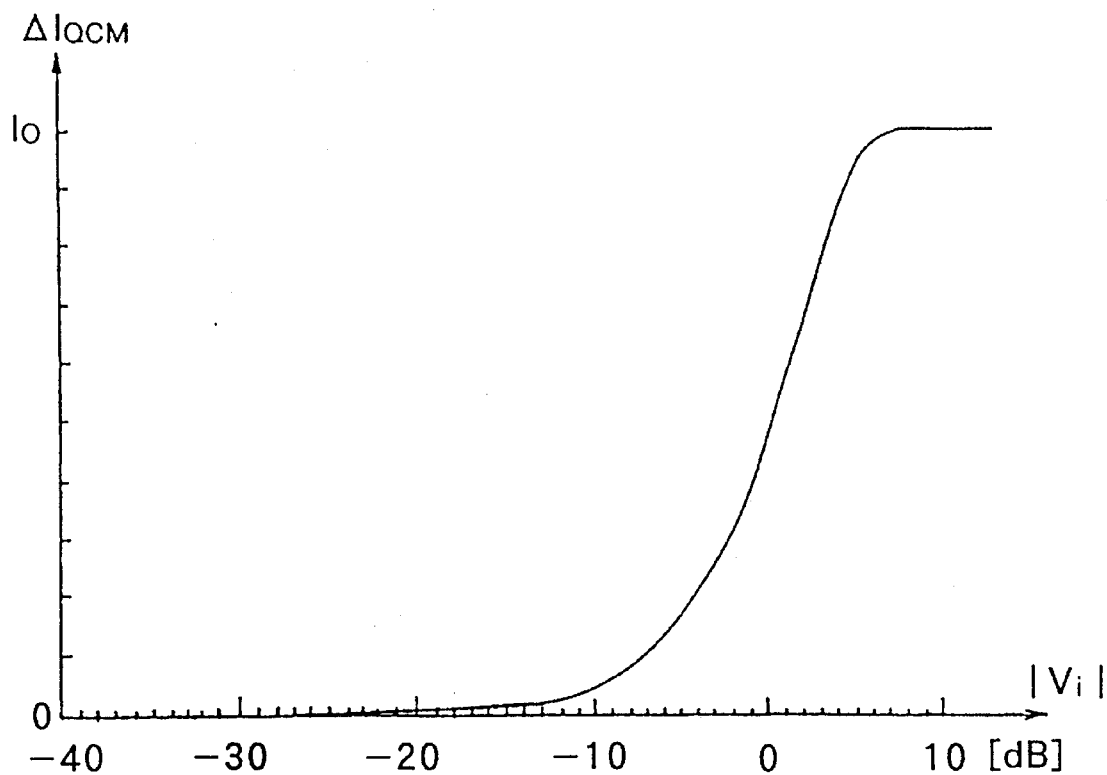
FIG. 9   $0dB = 20 \log |V_i/\sqrt{\frac{I_0}{\beta}}|$
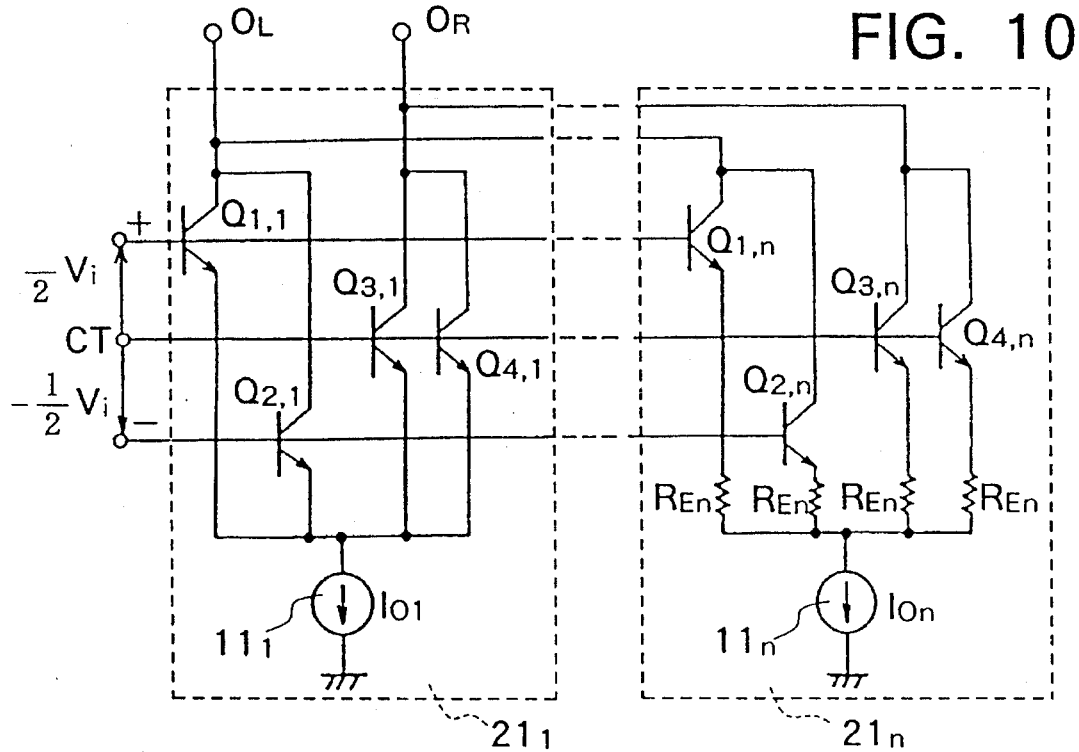
FIG. 10

LOGARITHMIC AMPLIFYING CIRCUIT USING QUADRITAIL CELLS

BACKGROUND OF THE INVENTION

1. Field of the Invention

The present invention relates to a logarithmic amplifying circuit, and relates in particular to a logarithmic amplifier which can be formed on a semiconductor integrated circuit with a wide input dynamic range characterized by excellent logarithmic accuracy and good temperature stability.

2. Description of the Related Art

Logarithmic amplifying circuits have been used in a variety of fields for outputting a logarithmic answer in response to an input signal. For realizing a logarithmic amplifying circuit, there are methods such as a first method which uses a logarithmic characteristic region included in a current-voltage characteristic curve for a PN junction, and a second method which provides a plurality of nonlinear amplifiers to combine output signals from each amplifier in order to obtain the approximate logarithmic characteristic of the output signals. According to the first method, it is possible to get logarithmic output signals with accuracy in the range from picoampere levels to several hundred microamperes. However, inasmuch as the frequency band width for the output signals is narrow and depends on signals, it cannot be applied to, for example, an IF (intermediate frequency) stage of a radio receiver. In contrast, according to the second method it is possible to expand the frequency band, and the method is also applicable to IF amplifiers and the like. Further, as a third method of realizing a logarithmic amplifying circuit, there is for example the method disclosed in U.S. Pat. No. 4,794,342 and Japanese Patent Laid-open Gazettes No. 292010/87 No. 292010/87 (JP, A, 62-292010) and No. 165805/92 (JP, A, 4-165805) all by the present inventor. According to the method, a plurality of cascade-connected differential amplifiers and a plurality of rectifiers are provided for the full-wave square-law detection of a differential input of each stage and a differential output of the last stage, and output signals of these rectifiers are then added to obtain the logarithmic output.

FIG. 1 is a block diagram showing a basic structure of a logarithmic amplifying circuit according to the third method. In FIG. 1, there are m number of differential amplifiers $91_1$ to $91_m$ cascade-connected in such a manner that a differential output signal from a former stage is inputted to a subsequent stage as a differential input signal. In FIG. 1, (m+1) number of rectifiers $92_1$ to $92_{m+1}$ are also provided and differential input signals to be inputted into differential amplifiers $91_1$ to $91_m$ are also inputted to rectifiers $92_1$ to $92_m$ respectively. Further, a differential output signal of the differential amplifier $91_m$ of the last stage is inputted into the (m+1)-th rectifier $92_{m+1}$. Rectifiers $92_1$ to $92_{m+1}$ are structured such that each rectifier outputs, as a current signal, a full-wave rectified signal which is proportional to the square of the input voltage when the input voltage is within a range of the upper and lower limits of predetermined values. Each rectifier also outputs an electric current of a first predetermined value when the input voltage is over the upper limit and outputs an electric current of a second predetermined value when the input voltage is less than the lower limit. Further, an adder 93 is provided to add all output currents $I_{RS1}$ to $I_{RS(m+1)}$ from respective rectifiers $92_1$ to $92_{m+1}$ for calculating the total sum. The output from the adder 93 becomes the output signal of the logarithmic amplifying circuit.

FIG. 2 shows, with reference to the logarithmic amplifying circuit of FIG. 1, the relation between the output currents $I_{RS1}$ to $I_{RS(m+1)}$ from respective rectifiers $92_1$ to $92_{m+1}$ and an addition current $I_{RSSI}$ of the adder 93. The horizontal axis of FIG. 2 is expressed in a dB scale, i.e., in a logarithmic scale. In the diagram, the symbol $G_O$ represents an amplification factor (gain) of each of differential amplifiers $91_1$ to $91_{m+1}$. As shown in the diagram, the synthetic amplification factor is given as $(m+1)G_O$, proving that logarithmic amplification has been achieved. Inasmuch as the logarithmic amplifying circuit implements logarithmic approximation by means of a number of rectifiers, the propriety of the logarithmic characteristic or the propriety of the approximation to the logarithmic characteristic is determined depending on the circuits or the rectifying characteristic constituting each full-wave rectifier. It is to be noted that the synthetic amplification factor can be adjusted by changing the amplification factor of each of differential amplifiers $91_1$ to $91_{m+1}$.

As a rectifier to be used in the logarithmic amplifying circuit of this kind which has a full-wave square rectification characteristic, as shown in the above Laid-open patent documents. There is a rectifier that is well known to the public in which input signals supplied to two pairs of unbalanced differential pairs composed of bipolar transistors or MOS transistors are cross-coupled and output signals therefrom are parallel-connected. The unbalanced differential pair can be prepared, if necessary, by using bipolar transistors each having an emitter of a different area or by using MOS transistors which each have different ratios of channel width W to channel length L, i.e., different values of W/L. The relation between the ratios of emitter areas or (W/L)s and the full-wave rectification characteristics of transistors composing the unbalanced differential pair is disclosed in the literature by the present inventor: K. Kimura, IEEE Transactions on Circuits and Systems-I, Vol. 39, No. 9, pp. 771–777, Sept. 1992." By referring to the literature, it is possible to constitute a proper full-wave rectifier.

However, in the full-wave rectifier of a conventional logarithmic amplifying circuit, since a drive current source, i.e., a tail current source, is required for every differential pair, the number of elements constituting the rectifiers is increased and the dissipation current is liable to be increased. Further, in two pairs of unbalanced differential pairs, since collectors of a larger size or drains of a larger size are coupled with each other, the resulting capacity becomes large and the drive current tends to be increased for expanding the frequency characteristic to the high frequency area. Thus, the conventional logarithmic amplifying circuit described above has a circuit structure which is disadvantageous for realizing a low dissipation current.

SUMMARY OF THE INVENTION

An object of the present invention is to constitute a full-wave rectifier used in a logarithmic amplifying circuit with transistors having collectors or drains of a small area and provide a logarithmic amplifying circuit that is driven with a small current.

An object of the present invention is achieved by a logarithmic amplifying circuit which comprises a differential amplifier, a plurality of rectifiers provided corresponding to input and output terminals of the logarithmic amplifying circuit, and an adder for adding the outputs from each of the rectifiers; wherein each rectifier further includes a quadritail cell consisting of a single tall current source and four transistors which are emitter-coupled or source-coupled and are driven by the tail current source, the base or gate of each of a first transistor and a second transistor of the quadritail cell being connected to one of the differential input pair of the rectifier, the collectors or drains of the first transistor and second transistor being connected in common to one output line of the rectifier, and the collectors or drains of the third transistor and fourth transistor of the quadritail cell being connected in common to the other output line of the rectifier, and the bases or gates of the third transistor and fourth transistor being connected in common to thereby receive a neutral voltage corresponding to the differential input pair.

An object of the present invention can also be achieved according to a logarithmic amplifying circuit which comprises a plurality of cascade-connected differential amplifiers, a plurality of rectifiers for receiving a differential Input of a differential amplifier of each stage and a differential output of the differential amplifier of the last stage, respectively, and outputting differential currents corresponding to the received input signals, an adder for adding the differential current of each rectifier and outputting signals according to the sum thus obtained and a neutral circuit which is provided for each of the rectifiers and which generates a neutral voltage corresponding to differential input signals of the rectifier, wherein the rectifier includes a quadritail cell consisting of a single tail current source and four bipolar transistors emitter-connected to the tail current source, the base of each of a first bipolar transistor and a second bipolar transistor of the quadritail cell being connected to one of the differential input pair of the rectifier, the collectors of the first bipolar transistor and second bipolar transistor being connected in common to one output line of the rectifier, the collectors of a third bipolar transistor and a fourth bipolar transistor of the quadritail cell being connected in common to the other output line of the rectifier, and the bases of the third bipolar transistor and fourth bipolar transistor being commonly connected to a line which is further connected to the output of the neutral circuit.

An object of the present invention can also be achieved according to a logarithmic amplifying circuit which comprises a plurality of cascade-connected differential amplifiers, a plurality of rectifiers for receiving a differential Input of a differential amplifier of each stage and a differential output of the differential amplifier of the last stage, respectively, and outputting differential currents corresponding to the received input signals, an adder for adding the differential current of each rectifier and outputting signals according to the sum thus obtained and a neutral circuit provided for each of the rectifiers which generates a neutral voltage corresponding to differential input signals of the rectifier, wherein the rectifier includes a quadritail cell consisting of a single tail current source and four MOS transistors source-connected to the tail current source, the gate of each of a first MOS transistor and second MOS transistor of the quadritail cell being connected to one of the differential input pair of the rectifier, the drains of the first MOS transistor and second MOS transistor being connected in common to one output terminal of the rectifier, the drains of a third MOS transistor and fourth MOS transistor of the quadritail cell being connected in common to the other output terminal of the rectifier, and the gates of the third MOS transistor and fourth MOS transistor being connected in common to a line which is further connected to the output of the neutral circuit.

The above and other objects, features and advantages of the present invention will become apparent from the following description referring to the accompanying drawings which illustrate examples of preferred embodiments of the present invention.

BRIEF DESCRIPTION OF THE DRAWINGS

FIG. 9 is a characteristic diagram with a horizontal axis expressed in a logarithmic scale showing the input-output characteristic of the rectifier shown in FIG. 7;

FIG. 10 is a block diagram showing another example of a rectifier using bipolar transistors;

DESCRIPTION OF THE PREFERRED EMBODIMENTS

Figure 1:
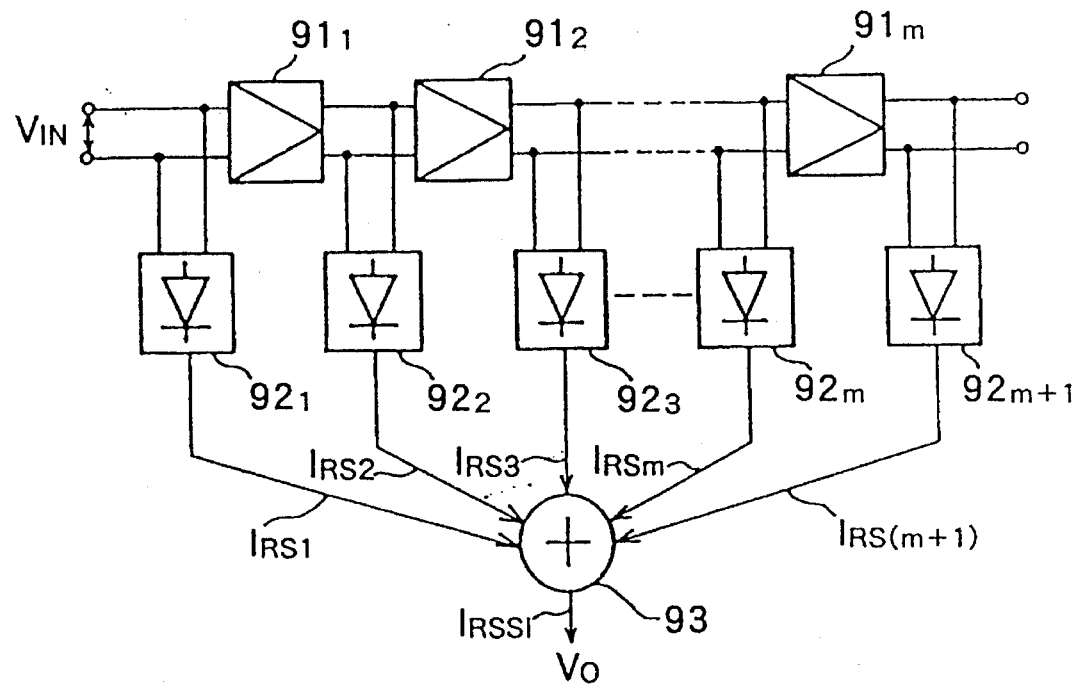
FIG. 1 is a block diagram showing the structure of a logarithmic amplifying circuit which employs cascade-connected differential amplifiers and rectifiers each having a rectification characteristic.
Figure 2:
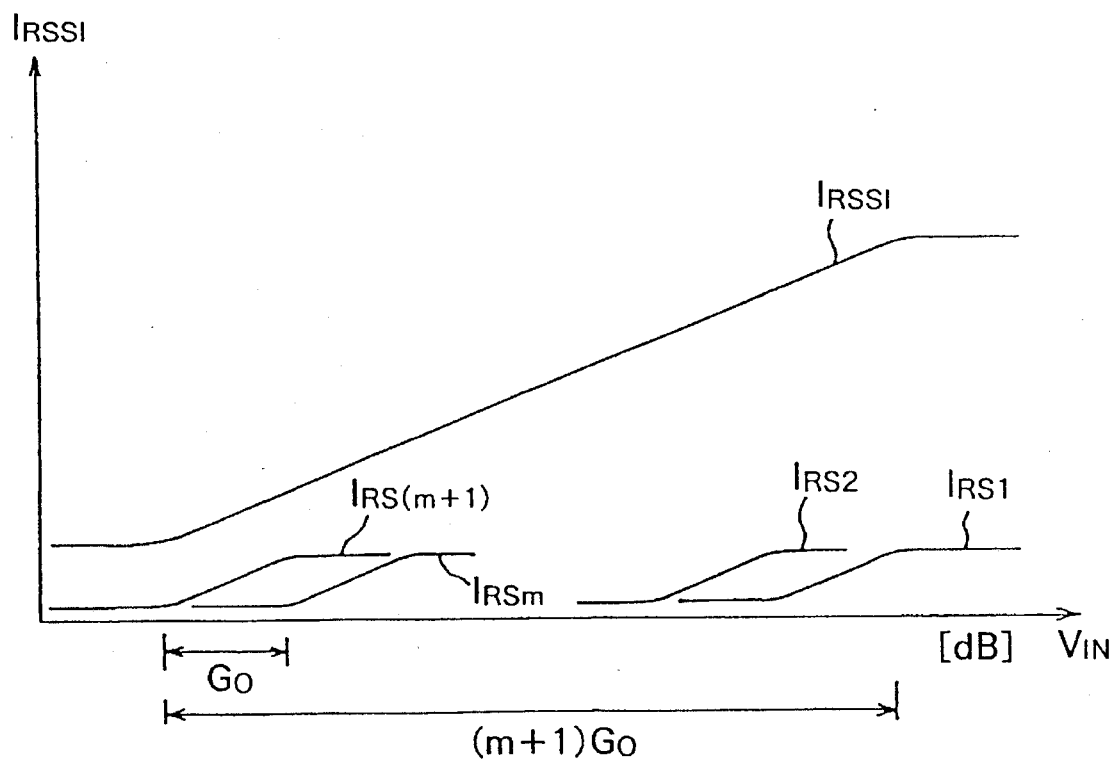
FIG. 2 is a diagram showing a characteristic of rectified currents in the logarithmic amplifying circuit of FIG. 1.
Figure 3:
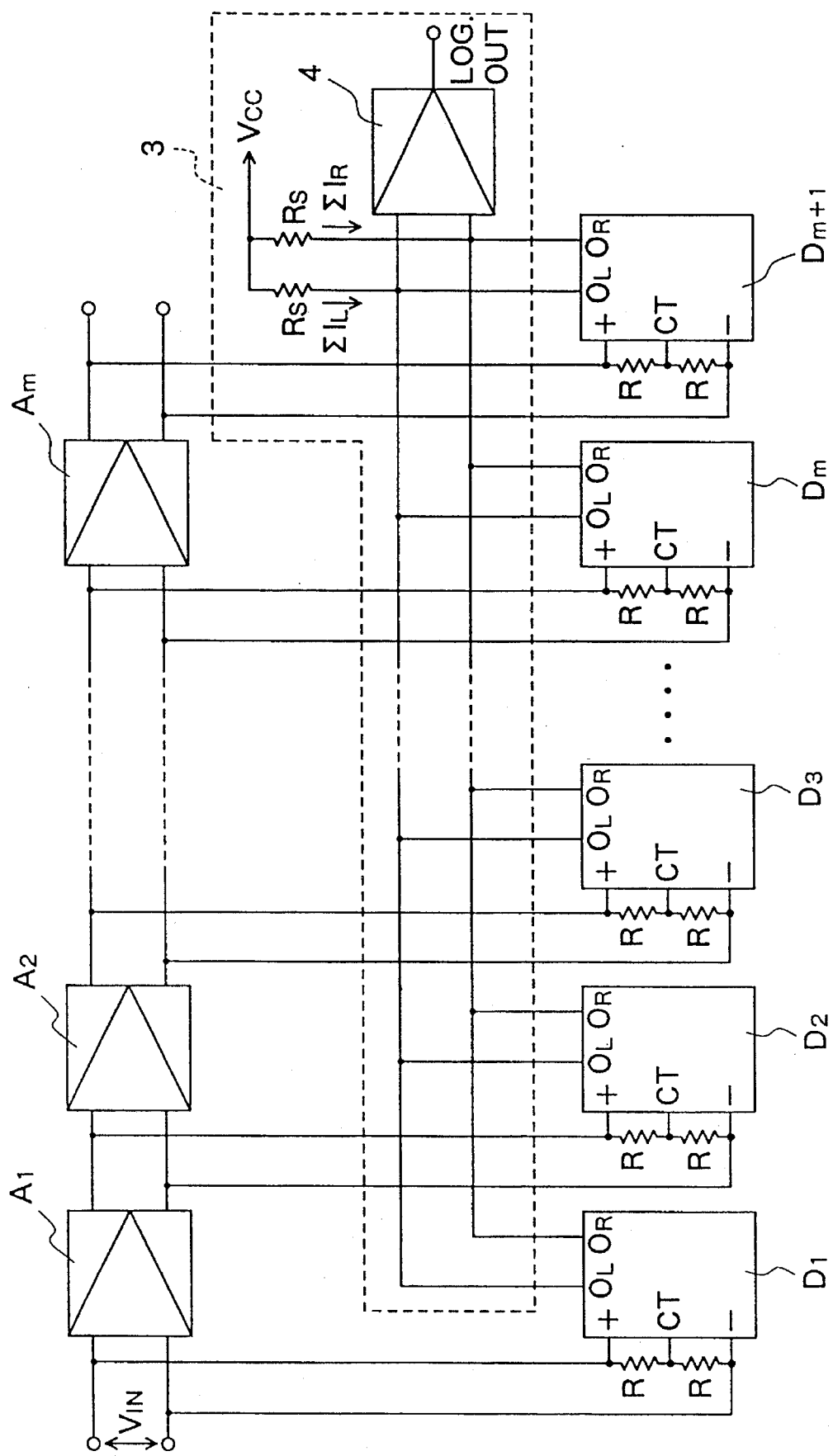
FIG. 3 is a circuit diagram showing the structure of a logarithmic amplifying circuit of an embodiment of the present invention.

A preferred embodiment of the present invention will next be described with reference to the drawings. A logarithmic amplifying circuit shown in FIG. 3 comprises a number m of differential amplifiers $A_1$ to $A_m$, a number (m+1) of full-wave rectifiers $D_1$ to $D_{m+1}$ and an adder 3. In FIG. 3, each of differential amplifiers $A_1$ to $A_m$ has an identical gain being cascade-connected to each other, and a differential output from the differential amplifier of a former stage becomes a differential input to the differential amplifier of a subsequent stage. A differential input of the differential amplifier $A_1$ of the first stage represents the input to this logarithmic amplifying circuit and $V_{IN}$ represents the input voltage to the circuit.

Full-wave rectifiers $D_1$ to $D_{m+1}$ all have the same structure with a square rectification characteristic. Each of full-wave rectifiers $D_1$ to $D_{m+1}$ comprises a pair of differential input terminals marked with "+" and "−" in the figure, a center input terminal CT corresponding to differential input terminals, and a pair of differential output terminals $O_L$, $O_R$ which output electric currents. Between each differential input terminal and the neutral input terminal CT, a resistance R of the same value is attached. Differential input terminals of full-wave rectifiers $D_1$ to $D_m$ are connected to input lines of differential amplifiers $A_1$ to $A_m$, respectively, and the differential input terminal of the remaining full-wave rectifier $D_{m+1}$ is connected to the differential output line of the differential amplifier $A_m$ of the last stage.

The adder 3 has two resistances $R_S$ of identical value, one end of each being connected to the power source $V_{CC}$, and the other end of one resistance $R_S$, being connected in common to one output terminal $O_L$ of each of full-wave rectifiers $D_1$ to $D_{m+1}$. In the same way, the other end of the other resistance RS is connected in common to the other output terminal $O_R$ of each of full-wave rectifiers $D_1$ to $D_{m+1}$. An operational amplifier 4 is provided in order to receive the differential voltage between these two resistances $R_S$. The output from the operational amplifier 4 represents a logarithmic output (LOG. OUT) of the logarithmic amplifying circuit.

Figure 4:
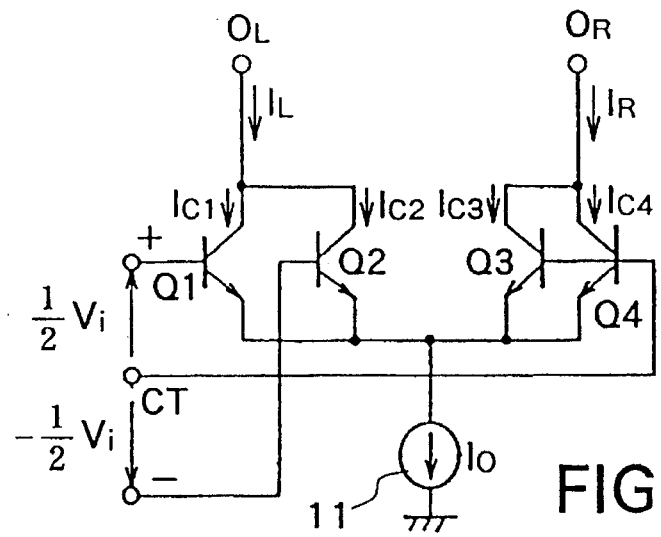
FIG. 4 is a block diagram showing the structure of an example of a rectifier using bipolar transistors.

A concrete structure of the full-wave rectifiers $D_1$ to $D_{m+1}$ will next be described. A circuit comprising four transistors emitter-connected or source-connected and driven by the tail current is commonly called a quadritail cell. FIG. 4 illustrates an example of a full-wave rectifier constituted with a quadritail cell which employs bipolar transistors. Four transistors $Q_1$ to $Q_4$ are of very similar characteristic and their emitters are connected in common as described above. A constant current source 11 is provided between the common node of emitters and the ground to allow a tail current $I_O$ to flow. Collectors of first and second transistors $Q_1$, $Q_2$ are connected in common to one output terminal $O_L$ and collectors of a third and fourth transistors $Q_3$, $Q_4$ are connected in common to the other output terminal $O_R$. The base of the first transistor $Q_1$ is connected to the (+) input terminal and the base of the second transistor $Q_2$ is connected to the (−) input terminal. Bases of the third and fourth transistors $Q_3$, $Q_4$ are connected in common to the neutral input terminal CT.

If collector currents of transistors $Q_1$ to $Q_4$ are expressed as $I_{C1}$ to $I_{C4}$, respectively, the following equations (1) are established when base width modulation is neglected.

$$I_{C1} = I_S \exp\left( \frac{V_{BE3} + \frac{1}{2} V_i}{V_T} \right)$$

$$I_{C2} = I_S \exp\left( \frac{V_{BE3} + \frac{1}{2} V_i}{V_T} \right)$$

$$I_{C3} = I_{C4} = I_S \exp\left( \frac{V_{BE3}}{V_T} \right) \quad (1)$$

where $V_T$ represents a thermovoltage which is expressed as $V_T=kT/q$. Here, k represents a Boltzmann's constant, T an absolute temperature, and q the unit electron charge. Further, $V_{BE3}$ represents a voltage between the base and emitter of the third transistor, $I_S$ a saturation current, and $V_i$ a differential input voltage. When output currents from output terminals $O_L$, $O_R$ are expressed by $I_L$, $I_R$, respectively, output currents $I_L$, $I_R$ satisfy the equation (2). Further, the equation (3) is established with reference to the tail current $I_O$.

$$I_L = I_{C1} + I_{C2}$$

$$I_R = I_{C3} + I_{C4} \quad (2)$$

$$I_{C1} + I_{C2} + I_{C3} + I_{C4} = \alpha_F I_O \quad (3)$$

Here, $\alpha_F$ is the DC common-base current gain factor of transistors $Q_1$ to $Q_4$. By solving equations (1) through (3), a differential current output $\Delta I_{QCB}$ of the quadritail cell is obtained as shown by equation (4).

$$\Delta I_{QCM} = I_L - I_R = (I_{C1} + I_{C2}) - (I_{C3} + I_{C4}) \quad (4)$$

$$= \alpha_F I_O \left\{ 1 - \mathrm{sech}^2\left( \frac{V_i}{4V_T} \right) \right\}$$

Figure 5:
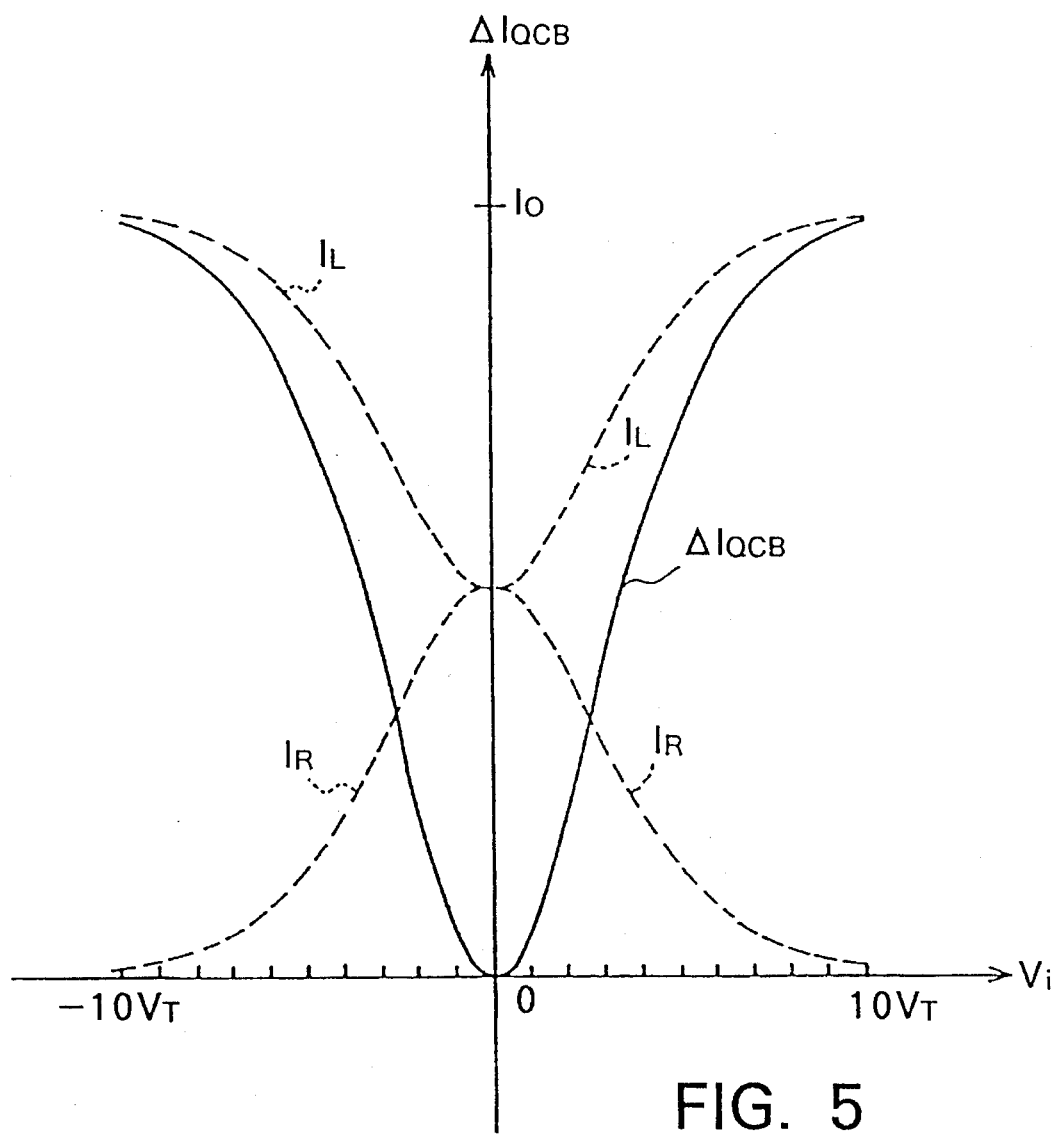
FIG. 5 is a characteristic diagram showing an input-output characteristic of the rectifier shown in FIG. 4.
Figure 6:
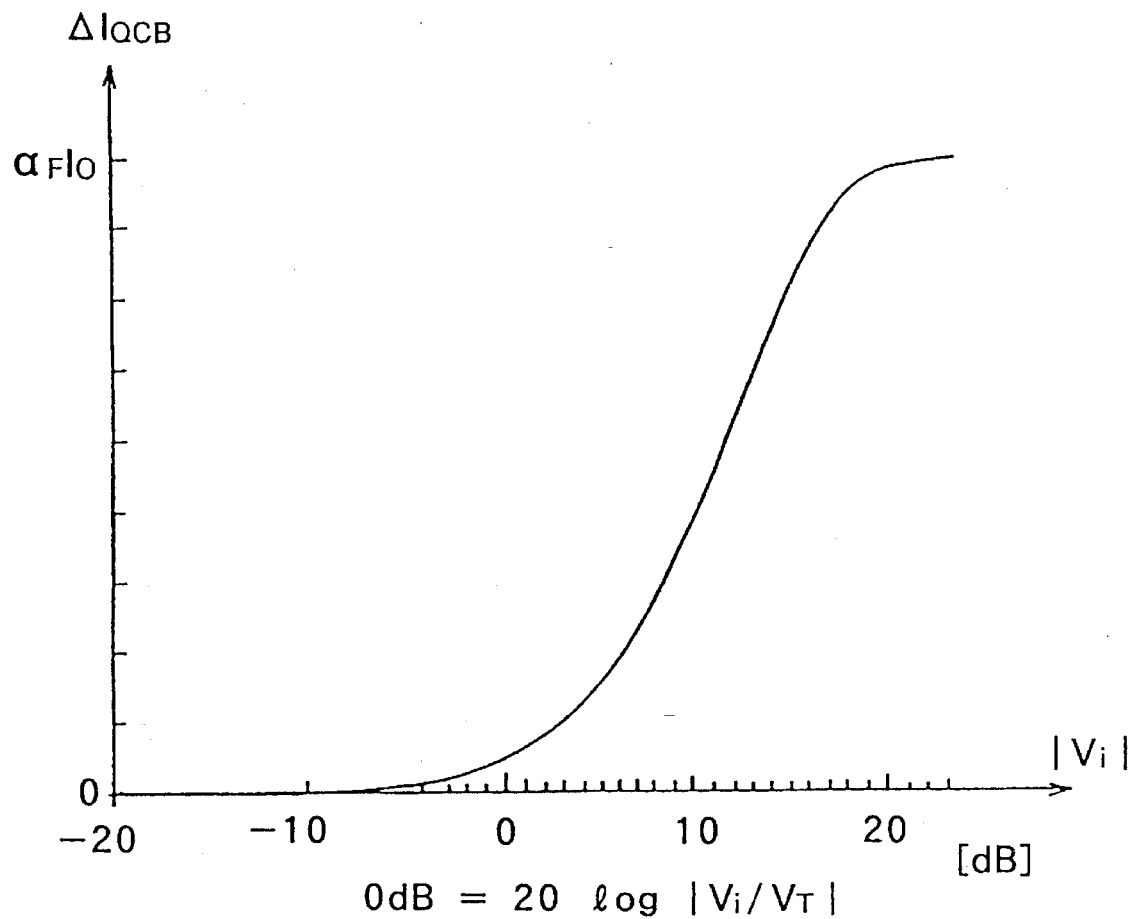
FIG. 6 is a characteristic diagram with a horizontal axis expressed in a logarithmic scale showing an input-output characteristic of the rectifier shown in FIG. 4.

FIGS. 5 and 6 show the output current characteristic of this bipolar quadritail cell. As is clear from the figures, the quadritail cell has a full-wave rectification characteristic which can be almost approximated by the square characteristic if the input voltage is limited to the range of, for example, $|V_i| \leq 2V_T$. Therefore, it can be understood that this bipolar quadritail cell is suitable for a rectifier to be used in the amplifying circuit. Considering the range of the operational voltage to be inputted to the bipolar quadritail cell, the logarithmic input dynamic range is approximately 10 dB, and hence a gain G of each differential amplifier is set to the order of 10 dB.

In the present embodiment, since a full-wave rectifier composed of a bipolar quadritail cell is used, it possible to reduce the number of current sources for the tail current compared with a ease employing a conventional rectifier with two pairs of unbalanced differential pairs and two current sources. Further, since the emitter area between the transistors need not be varied, it is possible to use transistors which each have a minimum area, resulting in a reduced parasitic capacity. Therefore, when the circuit receives input signals with an equal frequency, this logarithmic amplifying circuit can significantly reduce the dissipation current compared with a conventional logarithmic amplifying circuit.

Figure 7:
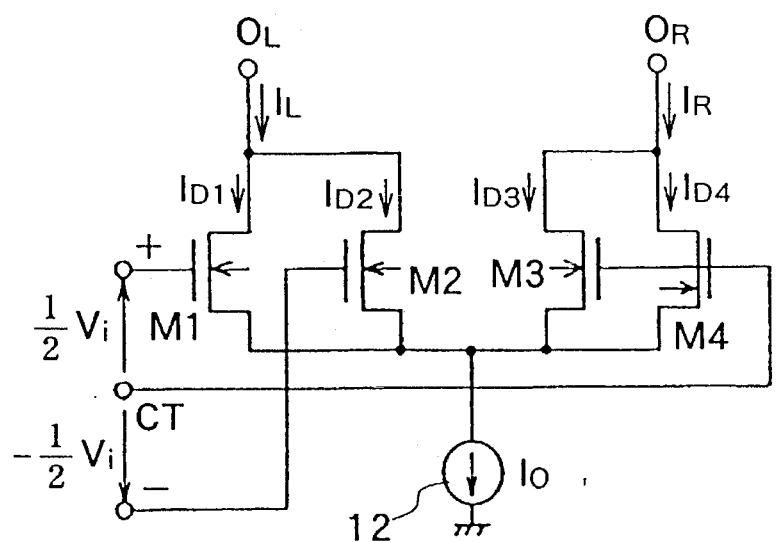
FIG. 7 is a block diagram showing the structure of an example of a rectifier using MOS transistors.

The quadritail cell can also be constituted by using MOS transistors of almost the same characteristic. FIG. 7 is a circuit diagram of an example in which each of full-wave rectifiers $D_1$ to $D_{m+1}$ is constituted by using a MOS quadritail cell. In FIG. 7, the sources of four MOS transistors $M_1$ to $M_4$ are connected in common, and a constant current source 12 is provided between the common node of the sources and the ground in order to cause a constant tail current $I_O$ to flow. The drains of first and second transistors $M_1$, $M_2$ are connected to one output terminal $O_L$, and the drains of third and fourth transistors $M_3$, $M_4$ are connected to the other output terminal $O_R$. The gates of the first and second transistors $M_1$, $M_2$ are connected to positive (+) and negative (−) input terminals, respectively, and the gates of the third and fourth transistors $M_3$, $M_4$ are connected to the neutral input terminal CT. The drain currents $I_{D1}$ to $I_{D4}$ of respective transistors $M_1$ to $M_4$ can be expressed as shown in equation (5) if: all the transistors $M_1$ to $M_4$ are in good coordination with each other, the body effect is neglected, and it is assumed that the relation between the drain current and the gate-to-source voltage of the MOS transistor operating in the saturation region is subject to the square law.

$$I_{D1} = \beta(V_{GS3} + \tfrac{1}{2}V_i - V_{TH})^2$$

$$I_{D2} = \beta(V_{GS3} - \tfrac{1}{2}V_i - V_{TH})^2$$

$$I_{D3} = I_{D4} = \beta(V_{GS3} - V_{TH})^2 \quad (5)$$

Here, $V_{GS3}$ is the gate-to-source voltage of the third transistor $M_3$, $V_i$ is a differential input voltage to the quadritail cell, $V_{TH}$ is a threshold voltage, and $\beta$ is a transconductance parameter. The transconductance parameter $\beta$ is expressed as given by equation (6).

$$\beta = \mu \left( \frac{C_{ox}}{2} \right) \left( \frac{W}{L} \right) \quad (6)$$

where $\mu$ is the effective mobility of a carrier, $C_{OX}$ is a capacity per unit area of a gate oxidized film of the MOS transistor, W is the width of the gate and L is the length of the gate.

The tail current $I_O$ and each output current $I_L$, $I_R$ are expressed as shown in equation (7).

$$I_L = I_{D1} + I_{D2}$$

$$I_R = I_{D3} + I_{D4}$$

$$I_{D1} + I_{D2} + I_{D3} + I_{D4} = IO \quad (7)$$

By solving equations (5) through (7), a differential current output $\Delta I_{QCM}$ of the quadritail cell is obtained as shown by equation (8).

$$\Delta I_{QCM} = I_L - I_R = (I_{D1} + I_{D2}) - (I_{D3} + I_{D4}) \tag{8}$$

$$= \begin{cases} \dfrac{\beta V_i^2}{2} & \left( |V_i| \leq \sqrt{\dfrac{2I_o}{3\beta}} \right) \\ \dfrac{1}{9} \left\{ \beta V_i^2 - 3I_O + 2\beta |V_i| \sqrt{2\left(\dfrac{6I_O}{\beta} - V_i^2\right)} \right\} & \left( \sqrt{\dfrac{2I_o}{3\beta}} \leq |V_i| \leq 2\sqrt{\dfrac{I_o}{\beta}} \right) \\ I_O & \left( |V_i| \geq 2\sqrt{\dfrac{I_o}{\beta}} \right) \end{cases}$$

Figure 8:
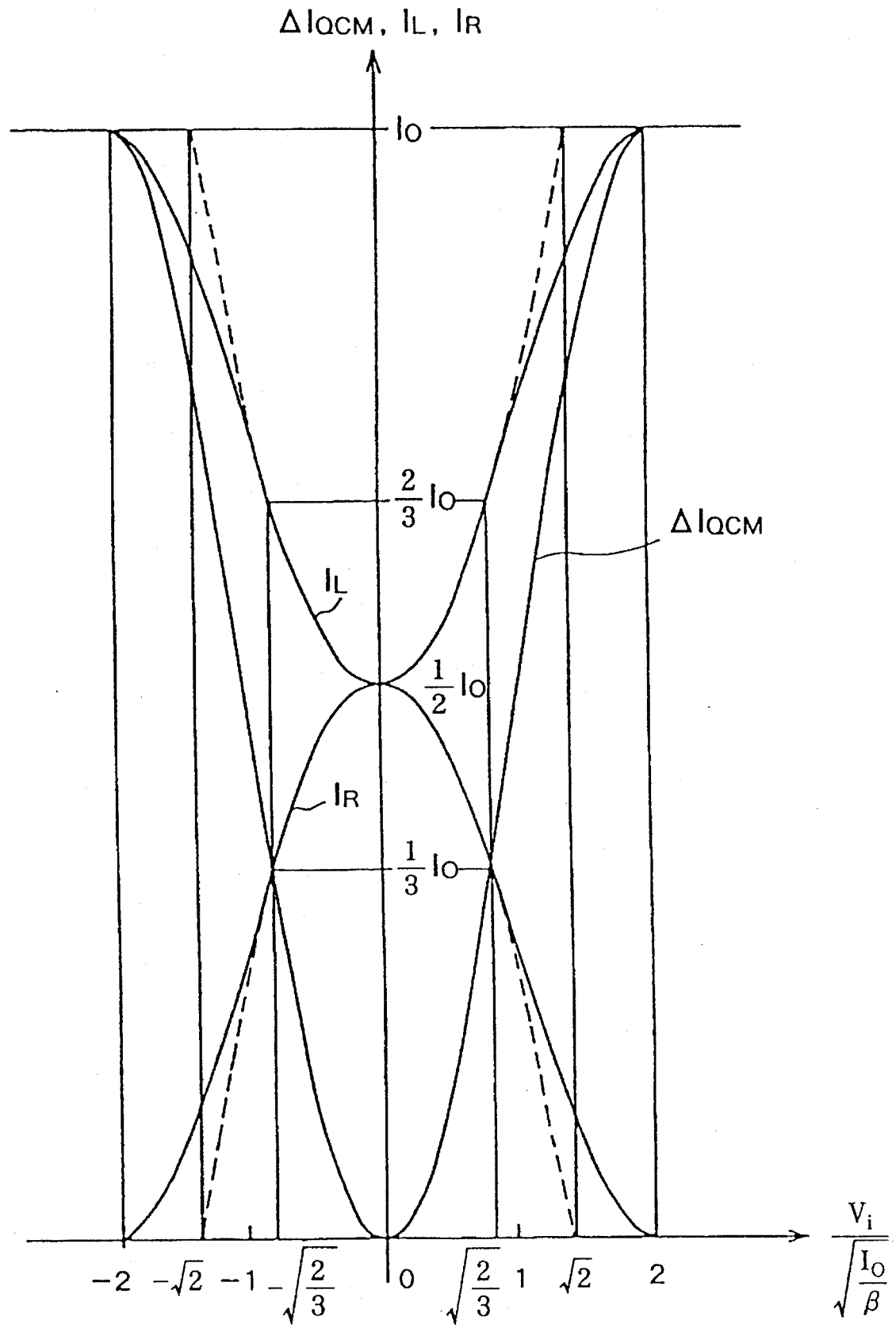
FIG. 8 is a characteristic diagram showing an input-output characteristic of the rectifier shown in FIG. 7.

FIGS. 8 and 9 show the output current characteristic of the MOS quadritail cell. As is clear from the figures, the quadritail cell has a full-wave rectification characteristic, and an ideal square law characteristic can be obtained if the input voltage is limited in the range of $|V_i| \leq (2I_o/3\beta)^{1/2}$. Therefore, it can be understood that this MOS quadritail cell is suitable for a rectifier to be used in the logarithmic amplifying circuit. Considering the range of the operational voltage to be inputted to the MOS quadritail cell, the logarithmic input dynamic range is approximately 8 dB, and hence a gain G of each differential amplifier is set to the order of 8 dB.

In the example shown in FIG. 7, since the full-wave rectifier used is composed of the MOS quadritail cell used, It is possible to reduce the number of current sources for the tail current than in the case employing a rectifier which uses two pairs of unbalanced differential pairs. Further, since the W/L ratio of each transistor is constant, it is possible to use transistors each having a required minimum area resulting in a reduced parasitic capacity. Therefore, when signals are inputted with an equal frequency, this logarithmic amplifying circuit can significantly reduce the dissipation current compared with the conventional logarithmic amplifying circuit.

Descriptions has been made above with reference to examples in which each of full-wave rectifiers $D_1$ to $D_{m+1}$ is constituted with a single quadritail cell. When the full-wave rectifier is constituted with the quadritail cell, the gain G of each of differential amplifiers $A_1$ to $A_{m+1}$ cannot exceed the range of 8 to 10 dB if the logarithmic accuracy of the logarithmic amplifying circuit is to be maintained. Generally, the gain G of a normal differential amplifying circuit can be increased to about 20 dB. Therefore, if the gain of the differential amplifier used in a logarithmic amplifying circuit can be increased to about 20 dB without causing deterioration in the logarithmic accuracy, the number of stages of the differential amplifier can be reduced in an inverse relation to the increase in the gain, thereby enabling a further reduction of the dissipation current of the whole circuit. In order to increase the gain of the differential amplifier, it is necessary to increase the logarithmic input dynamic range of each full-wave rectifier to about 20 dB in proportion to the gain of the differential amplifier to be increased.

FIG. 10 is a circuit diagram showing an example of a full-wave rectifier which has an expanded logarithmic input dynamic range. The full-wave rectifier is composed of a number n of bipolar quadritail cells $21_1$ to $21_n$ each connected in parallel. In the j-th quadritail cell $21_j$, a first, second, third and fourth transistors are expressed as $Q_{1,j}$, $Q_{2,j}$, $Q_{3,j}$, $Q_{4,j}$, respectively, and a tail current is expressed as $I_{oj}$. In this full-wave rectifier, an emitter resistance is provided in the emitter of each transistor in the second and subsequent quadritail cells. In other words, in the j-th quadritail cell $21_j$ (j$\geq$2), the emitter of each transistor $Q_{1,j}$, $Q_{2,j}$, $Q_{3,j}$, $Q_{4,j}$ is connected to a constant current source $11_j$ through each resistance $R_{Ej}$ of the same value. By inserting the emitter resistance $R_{Ej}$, the input voltage range is expanded corresponding to the product of the value of the resistance $R_{Ej}$ and the value of the tail current $I_{oj}$. Therefore, if the value of the emitter resistance of each quadritail cell is adjusted and determined so that the input voltage of each quadritail cell may be included in a range which varies exponentially or in a range which varies in the form of geometric progression, it becomes possible to approximate the rectification characteristic of the whole parallel-connected bipolar quadritail cells to the logarithmic characteristic. In other words, it becomes possible to expand the logarithmic input dynamic range of the full-wave rectifier corresponding to the essential gain of the differential amplifier. When the full-wave rectifier of this type is constructed and a bipolar process for manufacturing the semiconductor integrated circuit is applied thereto, it is effective to implement emitter degeneration by which the emitter resistance is inserted.

Figure 11:
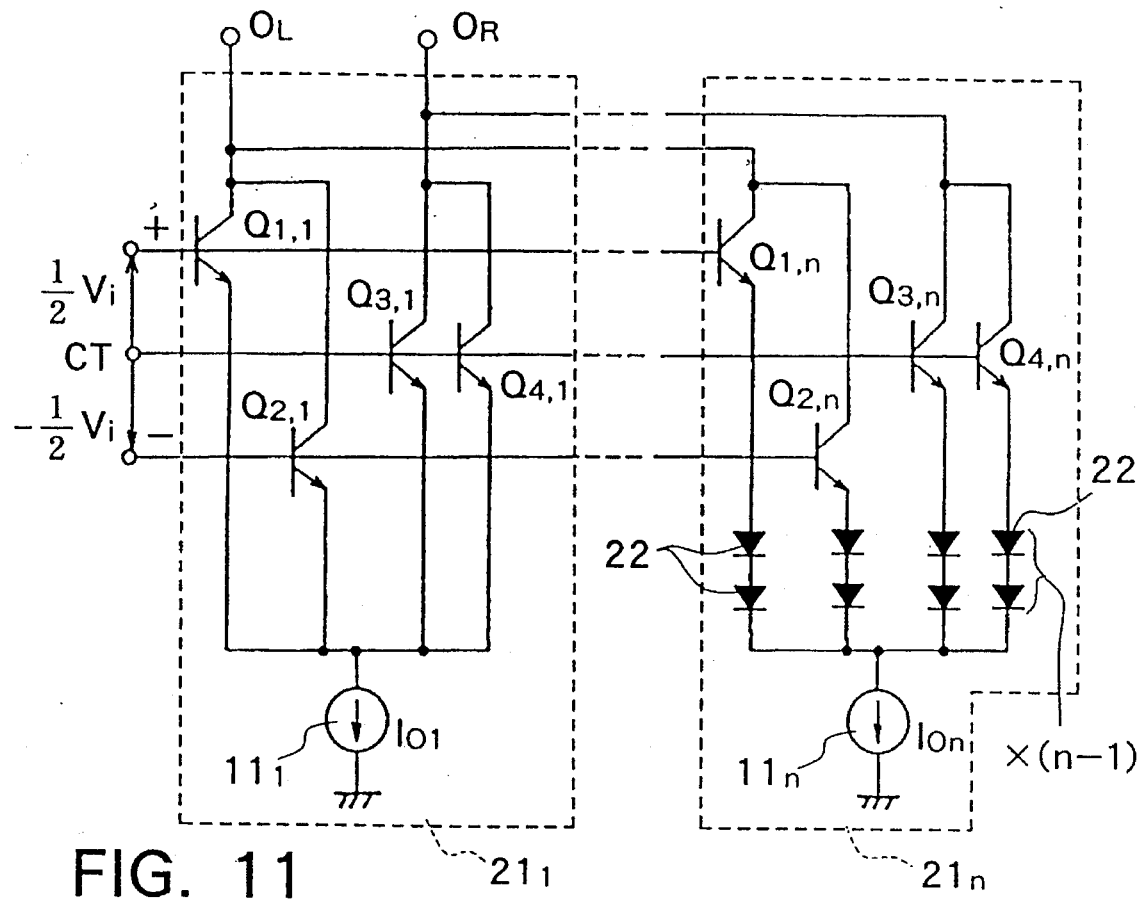
FIG. 11 is a block diagram showing still another example of a rectifier using bipolar transistors.

It is possible to insert a diode in place of the emitter resistance. FIG. 11 illustrates a structure of the full-wave rectifier in which a diode is inserted in place of the emitter resistance. In the j-th quadritail cell $21_j$, emitters of transistors $Q_{1,j}$, $Q_{2,j}$, $Q_{3,j}$, $Q_{4,j}$ are connected to a constant current source $11_j$ through each of a number (j-1) of series-connected diodes 22. If one diode is inserted in place of one emitter resistance, the input voltage range is expanded twice. If a number K of diodes are connected in series, the input voltage range is expanded (K+1) times and the source voltage is raised by about K×0.7 volt. Further, when the quadritail cell has a square rectification characteristic, the input voltage to the quadritail cell may be made smaller than that of the bipolar differential pair by inserting a diode to the emitter of the transistor which constitutes the differential pair; that is, It becomes possible to apply the input voltage divided by resistance to the quadrltail cell.

When the quadritail cell is composed of MOS transistors, in the same way as the emitter resistance of the above example, it is possible to expand the input voltage range by inserting the source resistance to the source of each transistor. However, in the MOS process to be employed for manufacturing a semiconductor integrated circuit, it is not usual to provide a source resistance, and instead, it is practical to provide a MOS transistor with a different transconductance parameter $\beta$ for every parallel-connected quadritail cell in order to obtain the operational input voltage of each quadritail cell, this voltage being different for each cell, thereby approximating its characteristic to the logarithmic characteristic.

Figure 12:
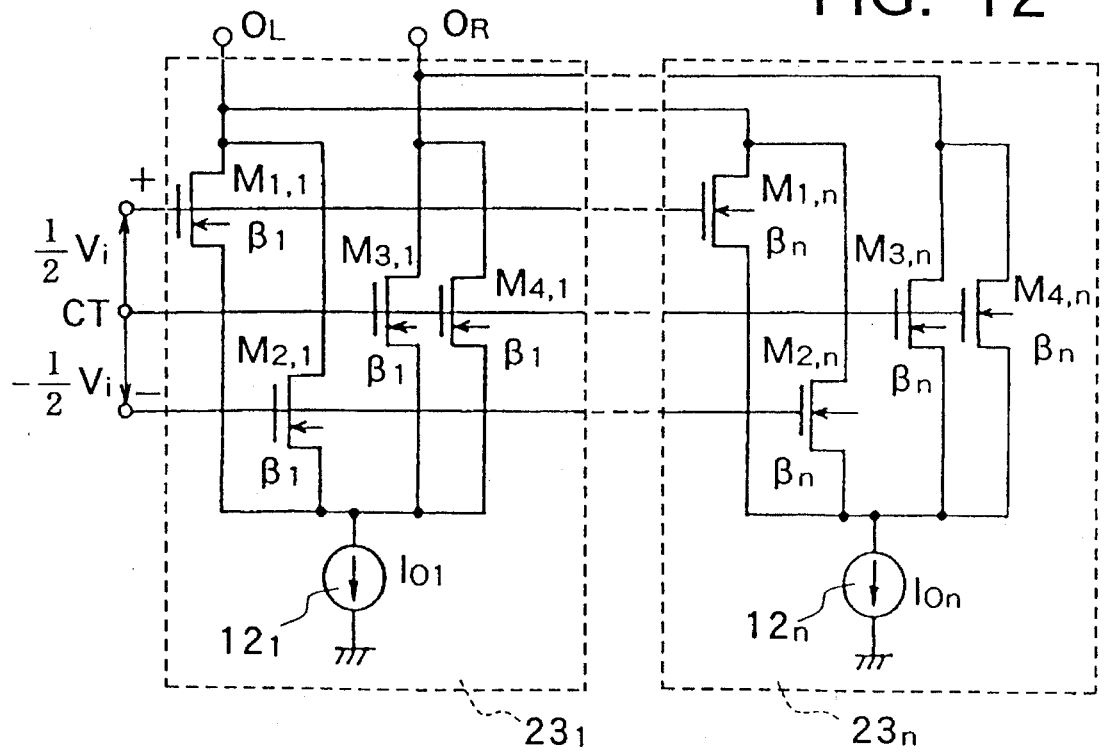
FIG. 12 is a block diagram showing another example of a rectifier using MOS transistors.

FIG. 12 shows a Full-wave rectifier composed of a number n of MOS quadritail cells $23_1$ to $23_n$ connected in parallel. In the j-th quadritail cell, a first, second, third and fourth MOS transistors are expressed as $M_{1,j}$, $M_{2,j}$, $M_{3,j}$, $M_{4,j}$, respectively, and a tail current being expressed as $I_{Oj}$, and a constant current source which serves as a tail current source being expressed by a mark $12_j$. A transconductance parameter of each MOS transistor $M_{1,j}$, $M_{2,j}$, $M_{3,j}$, $M_{4,j}$ of the j-th quadritail cell is expressed by $\beta_j$. Being provided with transconductance parameters of different values, MOS quadritail cells have respective rectification characteristics; however, they are approximate to each other, and their relation to each other can be expressed by multiplying by the square root of the result obtained by dividing the tail current by the transconductance parameter. Therefore, if the rectification output characteristic of each quadritail cell is represented by the input voltage data expressed in a logarithmic scale, the characteristic curve for each quadritail cell only shifts parallelly in the direction of the axis of the input voltage, each curve having a slope which is the same as shown in FIG. 9. If the ratio of the tail current to the transconductance parameter is multiplied by 6 for every MOS quadritail cell, the logarithmic input voltage range of each quadritail cell differs from the preceding cell by 8 dB. By arranging the full-wave rectifier in this way while approximating the rectification characteristic of the whole MOS quadritail cells arranged in parallel connection to the logarithmic characteristic, it becomes possible to make the logarithmic input dynamic range of the full-wave rectifier coordinate with the general gain of the differential amplifier.

It is to be understood that variations and modifications of the logarithmic amplifying circuit disclosed herein will be evident to those skilled in the art. It is intended that all such modifications and variations be included within the scope of the appended claims.

What is claimed is:

1. A logarithmic amplifying circuit comprising:

a differential amplifier;

a plurality of rectifiers coupled to an input terminal and output terminal of said differential amplifier; and an adder for adding an output signal of each of said rectifiers;

wherein said rectifiers each comprise a quadritail cell composed of a single tail current source and four emitter-connected or source-connected transistors driven by said tail current source;

bases or gates of a first transistor and a second transistor of said quadrltail cell being connected to respective terminals of a differential input pair of said rectifier, collectors or drains of said first and second transistors being connected in common to one output terminal of said rectifier, collectors or drains of a third and fourth transistors of said quadritail cell being connected in common to the other output terminal of said rectifier, bases or gates of said third and fourth transistors being connected in common, and a neutral voltage with reference to said differential input pair being applied to said bases or gates of said third and fourth transistors.

2. The logarithmic amplifying circuit according to claim 1, wherein a plurality of said differential amplifiers are cascade-connected to constitute an amplifier series and said rectifiers are coupled to input and output terminals and nodes included in said amplifier series.

3. The logarithmic amplifying circuit according to claim 1, wherein each of said rectifier comprises a plurality of said quadritail cells of different characteristics which are connected in parallel.

4. The logarithmic amplifying circuit according to claim 1, wherein said adder serves as a circuit for adding a differential current.

5. A logarithmic amplifying circuit comprising:

a plurality of cascade-connected differential amplifiers;

a plurality of rectifiers for receiving a differential input signal of a differential amplifier of each stage and a differential output signal of a differential amplifier of the last stage, respectively, and outputting differential currents corresponding to respective received input signals;

an adder for adding a differential current of each of said rectifiers and outputting a signal corresponding to the sum thus obtained; and a neutral circuit provided for every one of said rectifiers which generates a neutral point voltage with reference to differential input signals of said corresponding rectifier;

wherein said rectifiers each comprise a quadritail cell composed of a single tail current source and four bipolar transistors whose emitters are connected to said tail current source;

bases of a first bipolar transistor and a second bipolar transistor of said quadrltail cell being connected to a respective terminals of a differential input pair of said rectifier, collectors of said first and second bipolar transistors being connected in common to one output terminal of said rectifier, collectors of a third and fourth bipolar transistors of said quadritail cell being connected in common to the other output terminal of said rectifier, and bases of said third and fourth bipolar transistors being connected in common to a line which is further connected to an output of said neutral circuit.

6. The logarithmic amplifying circuit according to claim 5, wherein the characteristic of each of said bipolar transistors included in the quadritail cell is substantially identical to each other for each of said quadritail cells.

7. The logarithmic amplifying circuit according to claim 5, wherein each of said rectifier is composed of a plurality of said quadritail cells which are connected in parallel each having a different characteristic.

8. The logarithmic amplifying circuit according to claim 7, wherein said quadritail cells are different from each other in characteristic due to an emitter resistance which is different for each said quadritail cell, said emitter resistance being inserted between the emitter of each said bipolar transistor and said tail current source.

9. The logarithmic amplifying circuit according to claim 7, wherein said quadritail cells are different from each other in characteristic due to the number of forward diodes which is different For each said quadritail cell, said forward diode being inserted between the emitter of each said bipolar transistor and said tail current source.

10. A logarithmic amplifying circuit, comprising:

a plurality of cascade-connected differential amplifiers;

a plurality of rectifiers for receiving a differential input signal of a differential amplifier of each stage and a differential output signal of a differential amplifier of the last stage, respectively, and outputting differential currents corresponding to respective received input signals;

an adder for adding a differential current of each of said rectifiers and outputting a signal corresponding to the sum thus obtained; and a neutral circuit provided for every one of said rectifiers which generates a neutral point voltage with reference to differential input signals of said corresponding rectifier;

wherein said rectifiers each comprise a quadritail cell composed of a single tail current source and four MOS transistors whose sources are connected to said tail current source;

gates of a first MOS transistor and a second MOS transistor of said quadritail cell being connected to respective terminals of a differential input pair of said rectifier, drains of said first and second MOS transistors being connected in common to one output terminal of said rectifier, drains of a third and fourth MOS transistors of said quadritail cell being connected in common to the other output terminal of said rectifier, and gates of said third and fourth MOS transistors being connected in common to a line which is further connected to an output of said neutral circuit.

11. The logarithmic amplifying circuit according to claim 10, wherein the characteristic of each of said MOS transistors included in the quadritail cell is substantially identical to each other for each of said quadritail cells.

12. The logarithmic amplifying circuit according to claim 10, wherein each of said rectifier is composed of a plurality of said quadritail cells which are connected in parallel, and which each have a different characteristic.

13. The logarithmic amplifying circuit according to claim 10, wherein said quadritail cells are different from each other in characteristic due to a transconductance parameter of each of said MOS transistors which is changed for each of said quadritail cells.

* * * * *

UNITED STATES PATENT AND TRADEMARK OFFICE
CERTIFICATE OF CORRECTION

PATENT NO. : 5,471,166
DATED : November 28, 1995
INVENTOR(S) : Katsuji Kimura

It is certified that error appears in the above-indentified patent and that said Letters Patent is hereby corrected as shown below:

Col. 8, line 54, delete "quadrltail", insert --quadritail--.

Col. 9, line 48, delete "quadrltail", insert --quadritail--.

Signed and Sealed this

Twenty-first Day of May, 1996

Attest:

BRUCE LEHMAN

*Attesting Officer*     *Commissioner of Patents and Trademarks*